(12) United States Patent
Shu et al.

(10) Patent No.: US 9,496,238 B2
(45) Date of Patent: Nov. 15, 2016

(54) SLOPED BONDING STRUCTURE FOR SEMICONDUCTOR PACKAGE

(71) Applicant: Advanced Semiconductor Engineering, Inc., Kaohsiung (TW)

(72) Inventors: Min-Fong Shu, Kaohsiung (TW); Yi-Hsiu Tseng, Kaohsiung (TW); Kuan-Neng Chen, Kaohsiung (TW); Shu-Chiao Kuo, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/622,494

(22) Filed: Feb. 13, 2015

(65) Prior Publication Data

US 2016/0240503 A1 Aug. 18, 2016

(51) Int. Cl.
| | | |
|---|---|---|
| *H01L 23/31* | (2006.01) | |
| *H01L 23/49* | (2006.01) | |
| *H01L 23/00* | (2006.01) | |
| *H01L 23/498* | (2006.01) | |

(52) U.S. Cl.
CPC ........... *H01L 24/17* (2013.01); *H01L 23/3142* (2013.01); *H01L 23/49838* (2013.01); *H01L 24/81* (2013.01); *H01L 2224/1607* (2013.01); *H01L 2224/16227* (2013.01); *H01L 2224/81191* (2013.01); *H01L 2224/81201* (2013.01); *H01L 2224/81815* (2013.01); *H01L 2924/1515* (2013.01); *H01L 2924/20103* (2013.01); *H01L 2924/20104* (2013.01); *H01L 2924/20105* (2013.01); *H01L 2924/3511* (2013.01); *H01L 2924/384* (2013.01)

(58) Field of Classification Search
CPC ... H01L 24/17; H01L 24/81; H01L 23/3142; H01L 23/49838
See application file for complete search history.

(56) References Cited

U.S. PATENT DOCUMENTS

| | | | | |
|---|---|---|---|---|
| 5,898,575 A | * | 4/1999 | Hawthorne | H01L 23/16 174/138 G |
| 6,093,029 A | * | 7/2000 | Kwon | H01L 25/105 257/685 |
| 6,114,221 A | * | 9/2000 | Tonti | H01L 21/76898 257/686 |
| 6,517,359 B1 | * | 2/2003 | Felps | H01R 13/2421 439/246 |
| 7,045,443 B2 | * | 5/2006 | Matsui | H01L 21/76898 257/686 |
| 8,076,177 B2 | | 12/2011 | Chen et al. | |
| 8,115,319 B2 | | 2/2012 | Hsu et al. | |
| 8,237,273 B2 | | 8/2012 | Hsu et al. | |
| 8,252,680 B2 | * | 8/2012 | Lavoie | H01L 21/2855 257/751 |
| 8,288,853 B2 | * | 10/2012 | Huang | H01L 21/76898 257/686 |
| 8,399,936 B2 | * | 3/2013 | Birner | H01L 21/76898 257/288 |
| 8,415,804 B2 | * | 4/2013 | Lee | H01L 21/76898 257/758 |
| 8,431,478 B2 | * | 4/2013 | Shen | H01L 24/11 257/738 |
| 8,435,836 B2 | * | 5/2013 | Fay | H01L 24/03 438/109 |
| 8,581,399 B2 | * | 11/2013 | Tsai | H01L 24/13 257/737 |
| 2009/0289360 A1 | * | 11/2009 | Takahashi | H01L 23/49811 257/737 |
| 2010/0059897 A1 | * | 3/2010 | Fay | H01L 24/03 257/777 |
| 2010/0065949 A1 | * | 3/2010 | Thies | H01L 21/76898 257/621 |
| 2010/0154211 A1 | * | 6/2010 | Uyama | H05K 3/4038 29/846 |
| 2012/0306104 A1 | * | 12/2012 | Choi | H01L 23/49811 257/782 |
| 2014/0264854 A1 | * | 9/2014 | Thacker | H01L 24/14 257/738 |

* cited by examiner

*Primary Examiner* — Ida M Soward
(74) *Attorney, Agent, or Firm* — Foley & Lardner LLP; Cliff Z. Liu; Angela D. Murch

(57) ABSTRACT

A bonding structure includes a substrate having a top surface and including at least one bonding pad. Each bonding pad is disposed adjacent to the top surface of the substrate and has a sloped surface. A semiconductor element includes at least one pillar. Each pillar is bonded to a portion of the sloped surface of a corresponding bonding pad, and a gap is formed between a sidewall of the pillar and the sloped surface of the corresponding bonding pad.

19 Claims, 10 Drawing Sheets

US 9,496,238 B2

SLOPED BONDING STRUCTURE FOR SEMICONDUCTOR PACKAGE

BACKGROUND

1. Technical Field

The present disclosure relates to a semiconductor package and method of manufacturing the same, and, more particularly, to a bonding structure for a semiconductor package and method of manufacturing the same.

2. Description of the Related Art

In a known semiconductor flip-chip bonding process, a nickel layer is plated on a metal pillar of an upper chip to serve as a barrier layer, and then a solder is formed on the nickel layer. Next, the upper chip is placed on a lower chip or a substrate, where the solder on the metal pillar will contact a surface finish layer on a bonding pad of the lower chip or the substrate. Then, a reflow process is performed to melt the solder and to bond the metal pillar to the bonding pad, to form a flip-chip bonding structure.

In the known process, a large amount of solder is used in order to provide effective bonding between the metal pillar and the bonding pad. Since the outer diameter of the solder cannot be effectively decreased, a pitch between the metal pillars cannot be effectively reduced. In addition, to make the solder reach a molten state, the solder is heated to above 300° C. However, in such a high-temperature environment, the upper chip, the lower chip or the substrate is prone to warping, and the metal pillar is easily oxidized. To avoid oxidation of the metal pillar, another known technique is to perform high-temperature bonding in a vacuum environment. However, such a technique will increase the manufacturing cost, and cannot solve the warpage problem.

Moreover, to make the reflow process of the solder be carried out at a lower temperature, a solder is typically used with a reflux agent or an organic compound. Removal of such reflux agent or organic compound afterwards typically will raise environmental issues. Addressing these issues will incur additional cost.

Therefore, it is desirable to provide a semiconductor bonding structure and process that can solve the above problems.

SUMMARY

One aspect of the present disclosure relates to a bonding structure useful for a semiconductor package. In an embodiment, the bonding structure comprises a substrate and a semiconductor element. The substrate has a top surface and includes at least one bonding pad wherein each bonding pad is disposed adjacent to the top surface of the substrate and has a sloped surface. The semiconductor element includes at least one pillar, wherein each pillar is bonded to a portion of the sloped surface of a corresponding one of the at least one bonding pad, and a gap is formed between a sidewall of the pillar and the sloped surface of the corresponding bonding pad.

Another aspect of the present disclosure relates to a bonding structure useful for a semiconductor package. In an embodiment, the bonding structure comprises a substrate and a semiconductor element. The substrate has a top surface and includes at least one bonding pad, wherein each bonding pad is disposed adjacent to the top surface of the substrate and has a sloped surface with a first slope L1. The semiconductor element includes at least one pillar, wherein each pillar is bonded to a portion of the sloped surface of a corresponding one of the at least one bonding pad and has a sidewall with a second slope L2. The absolute value of the first slope L1 is less than the absolute value of the second slope L2.

Another aspect of the present disclosure relates to a method of manufacturing a bonding structure useful in a semiconductor package. In an embodiment, the method comprises: providing a substrate, wherein the substrate includes a top surface and at least one bonding pad disposed adjacent to the top surface of the substrate, at least one bonding pad having a sloped surface with a first slope L1; providing a semiconductor element, wherein the semiconductor element includes at least one pillar, and at least one pillar has a sidewall with a second slope L2, wherein the absolute value of the first slope L1 is smaller than the absolute value of the second slope L2; and bonding at least one pillar to a portion of the sloped surface of corresponding ones of the at least one bonding pad.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain element or certain plane of an element, as described in the specification and shown in the figures. Furthermore, it should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
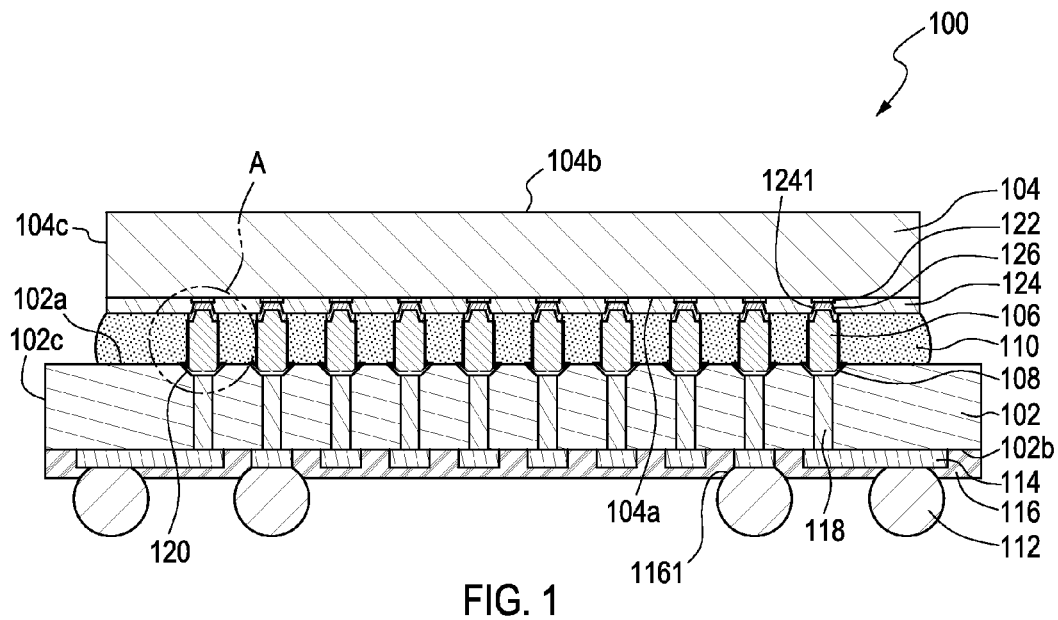
FIG. 1 illustrates a cross-sectional view of a semiconductor package according to an embodiment of the present disclosure.

FIG. 1 illustrates a cross-sectional view of a semiconductor package 100 according to an embodiment of the present disclosure. The semiconductor package 100 comprises a substrate 102, a semiconductor element 104, an underfill 110 and a plurality of connecting elements 112 for external connection.

The substrate 102 can be made of, for example, ceramic, glass-reinforced epoxy (e.g., FR4), polyimide, silicon, or Bismaleimide/Triazine (BT) resin. The substrate 102 has a top surface 102a, a bottom surface 102b, a side surface 102c, a lower circuit layer 114, a lower insulation layer 116, at least one conductive via 118, at least one bonding pad 108 and at least one cavity 120. The top surface 102a is opposite to the bottom surface 102b. A side surface 102c extends between the top surface 102a and the bottom surface 102b.

The lower circuit layer 114 is disposed adjacent to the bottom surface 102b of the substrate 102. The lower insulation layer 116 substantially covers the lower circuit layer 114 and the bottom surface 102b of the substrate 102, and has a plurality of openings 1161 to expose at least a portion of the lower circuit layer 114 so that the lower circuit layer 114 can electrically connect to the external environment through the connecting elements 112 disposed in the openings 1161. The lower circuit layer 114 may comprise, for example, copper or other metal, or a metal alloy. In one embodiment, the lower insulation layer 116 is a solder mask, the material of which is, for example, a polyimide (PI).

The conductive vias 118 extend from the top surface 102a of the substrate 102 to the bottom surface 102b of the substrate 102 so as to provide an electrical connection between the lower circuit layer 114 and the bonding pads 108. In addition, in this embodiment, the substrate 102 defines the cavities 120 for the bonding pads 108 to be disposed in. A bonding pad 108 may be electrically connected to and aligned with a respective one of the conductive vias 118. In this embodiment, one end of a conductive via 118 connects to the lower circuit layer 114, and the other end of the conductive via 118 connects to the bottom portion of a bonding pad 108. The material of the conductive via 118 may comprise copper or other metal, or a metal alloy. The bonding pads 108 may comprise, for example, one of, or a combination of, copper, gold, indium, tin, silver, palladium, osmium, iridium, ruthenium, titanium, magnesium, aluminum, cobalt, nickel, or zinc.

The semiconductor element 104 may be a chip, a package, or an interposer. The semiconductor element 104 has a first surface 104a, a second surface 104b, a side surface 104c, at least one pad 122, an insulation layer 124, at least one under bump metallization (UBM) 126, and at least one pillar 106. The first surface 104a is opposite to the second surface 104b. The side surface 104c extends between the first surface 104a and the second surface 104b. The pads 122 are disposed on the first surface 104a of the semiconductor element 104. The pads 122 may comprise, for example, one of, or a combination of, copper, gold, indium, tin, silver, palladium, osmium, iridium, ruthenium, titanium, magnesium, aluminum, cobalt, nickel, or zinc.

The insulation layer 124 covers a portion of each of the pads 122 and further covers the first surface 104a of the semiconductor element 104. The insulation layer 124 has at least one opening 1241. Each opening 1241 exposes at least a portion of a pad 122. and a UBM 126 is disposed in the opening 1241 and contacts the pad 122. The insulation layer 124 may be, for example, a solder mask (the material of which is, for example, PI) or a passivation layer (the material of which is a metal oxide). In an embodiment, the UBMs 126 may be formed from a metal, metal alloy, multi-metal or multi-alloy stack, such as a multi-alloy stack including, for example, a combination of copper, nickel, vanadium, chromium, and gold. The pillars 106 are disposed on respective UBMs 126 and are physically bonded to and electrically connected to respective bonding pads 108. The pillars 106 may comprise copper or another metal, or a metal alloy.

The underfill 110 is disposed between the semiconductor element 104 and the substrate 102 to protect the pillars 106 from oxidation, moisture, and other environment conditions to meet the packaging application requirements. It should be noted that the underfill 110 may not be necessary.

As described above, the pillars 106 are bonded to the bonding pads 108 directly. That is, the solder material of the known process for bonding may not be used, or may be reduced. Therefore, a pitch between the pillars 106 can be effectively reduced. In addition, the cavities 120 are recessed from the top surface 102a of the substrate 102, and the bonding pads 108 are disposed on the sidewalls of the cavities 120, such that the bonding pads 108 may also be recessed from the top surface 102a of the substrate 102. It is noted that since a portion of each pillar 106 is accommodated within the substrate 102, (i.e., within the cavity 120) and bonded to a bonding pad 108, such bonding structure can provide a better lock-and-key effect.

Figure 1A:
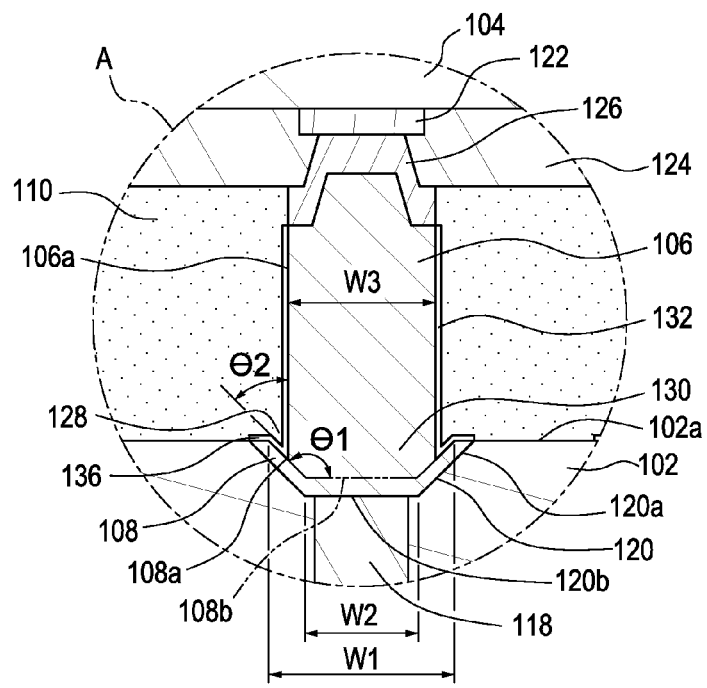
FIG. 1A illustrates an enlarged view of a bonding structure in the semiconductor package illustrated in FIG. 1 according to one embodiment of the present disclosure.

FIG. 1A illustrates an enlarged view of an area A of a bonding structure in the semiconductor package 100 illustrated in FIG. 1. The bonding structure connects the substrate 102 and the semiconductor element 104. In the portion of the bonding structure illustrated in FIG. 1A, the substrate 102 has the top surface 102a, a cavity 120 and a bonding pad 108. The cavity 120 has a cavity sidewall 120a and a cavity bottom 120b. The cavity sidewall 120a may be linear or curved, and is non-perpendicular to the cavity bottom 120b. The cavity sidewall 120a is tapered at an angle θ1 relative to the cavity bottom 120b, wherein the angle θ1 may be about 90° to about 105°, about 90° to about 120°, about 90° to about 135°, about 90° to about 150°, about 90° to about 165°, or about 90° to about 180° so that the cavity sidewall 120a is inclined with respect to the cavity bottom 120b. As shown in FIG. 1A, a cross section outline of the cavity 120 is a trapezoid shape. Such shape may be formed by applying a dry etching process to the substrate 102. In an embodiment, the dry etching process is carried out by using a reactive plasma.

The bonding pad 108 is disposed on at least a portion of the cavity sidewall 120a and at least a portion of the cavity bottom 120b. The bonding pad 108 conforms to the cavity sidewall 120a and the cavity bottom 120b, and has a pad bottom surface 108b corresponding to the cavity bottom 120b, and a sloped surface 108a corresponding to the cavity sidewall 120a. The sloped surface 108a of the bonding pad 108 has a slope (referred to in this disclosure as L1). The sloped surface 108a is tapered at an angle θ1 relative to the pad bottom surface 108b, wherein the angle θ1 may be about 90° to about 105°, about 90° to about 120°, about 90° to about 135°, about 90° to about 150°, about 90° to about 165°, or about 90° to about 180° so that the sloped surface 108a is inclined with respect to the pad bottom surface 108b. It is noted that the sloped surface 108a is also inclined with respect to the top surface 102a of the substrate 102. In addition, a portion of the bonding pad 108 that is not bonded with the pillar 106 is covered by a pad metal oxide liner 136.

The bonding pad 108 defines an opening 130 (a space enclosed by the sloped surface 108a of the bonding pad 108) which has a width from one side of the opening 130 to the opposite side of the opening 130: a maximum width and a minimum width of the opening 130 are identified in FIG. 1 by W1 and W2, respectively, and the maximum width W1 is greater than the minimum width W2. As shown in FIG. 1A, a cross section outline of the cavity 120 is in a trapezoid shape, and the bonding pad 108 conforms to the shape of the cavity 120 along the cavity sidewall 120a and the cavity bottom 120b. Thus, in the embodiment illustrated in FIG. 1A, the bonding pad 108 covers the cavity sidewall 120a and the cavity bottom 120b. Alternatively, in some embodiments, the bonding pad 108 may be disposed on a portion of the cavity sidewall 120a without being disposed on a portion of the cavity bottom 120b; in other embodiments, the bonding pad 108 may cover the cavity sidewall 120a without being disposed on a portion of the cavity bottom 120b; and in yet other embodiments, the bonding pad 108 may be disposed on a portion of the cavity sidewall 120a and cover the cavity bottom 120b.

As also illustrated in FIG. 1A, the pillar 106 is disposed on the UBM 126 of the semiconductor element 104. The metal pillar 106 is bonded to a portion of the sloped surface 108a of the bonding pad 108 of the substrate 102, to electrically connect the semiconductor element 104 to the substrate 102. The pillar 106 has a sidewall 106a and a pillar metal oxide liner 132. The pillar metal oxide liner 132 is formed on a portion of the sidewall 106a that is not bonded with the bonding pad 108. The sidewall 106a has a slope (referred to in this disclosure as L2). In the embodiment illustrated in FIG. 1A, the sidewall 106a is substantially perpendicular to the top surface 102a of the substrate 102, and the absolute value of the slope L1 of the sloped surface 108a is less than the absolute value of the slope L2 of the sidewall 106a. An average width W3 of the pillar 106 is designed to be greater than the minimum width W2 of the opening 130 and less than the maximum width W1 of the opening 130. Therefore, during assembly, when the pillar 106 is moved toward the bonding pad 108, the pillar 106 will contact a portion of the sloped surface 108a of the bonding pad 108, and a gap 128 is formed between the sidewall 106a of the pillar 106 and the sloped surface 108a of the bonding pad 108. In an embodiment, the average width W3 refers to an average diameter of a pillar 106. By defining the average width W3 of the pillar 106 to be greater than the minimum width W2 and less than the maximum width W1 of the opening 130, the pillar 106 can be disposed on the bonding pad 108 in a more efficient and concise manner by contacting the sloped surface 108a of the bonding pad 108 first.

The sidewall 106a is inclined at an angle θ2 relative to the sloped surface 108a of the bonding pad 108. The angle θ2 can be about 0° to about 90°, about 0° to about 15°, about 15° to about 30°, about 30° to about 45°, about 45° to about 60°, about 60° to about 75°, or about 75° to about 90° to form the gap 128. By defining the angle θ2, or defining the absolute value of the slope L1 of the sloped surface 108a to be less than the absolute value of the slope L2 of the sidewall 106a, the effects mentioned above (i.e., the pillar 106 can be disposed on the bonding pad 108 in a more efficient and concise manner by contacting the sloped surface 108a of the bonding pad 108 first) can also be achieved.

The slope of the sloped surface 108a allows the pillar 106 to slide along the sloped surface 108a during flip-chip bonding, so that even if the alignment accuracy between the substrate 102 and the semiconductor element 104 is poor, the pillar 106 can still be disposed in the opening 130 and properly contact the pad bottom surface 108b of the bonding pad 108, to provide for more reliable bonding. Therefore, the alignment tolerance of the flip-chip bonding structure can be improved. In one embodiment, the material of the bonding pad 108 is the same as that of the pillar 106 (e.g., both are copper), and the pillar 106 is bonded to the bonding pad 108 by metal fusion bonding or a metal eutectic bonding such that there is no actual interface between the pillar 106 and the bonding pad 108 after bonding. Accordingly, the dotted line between the pillar 106 and the bonding pad 108 in FIG. 1A is provided by way of illustration, and does not necessarily represent an actual interface.

Figure 1B:
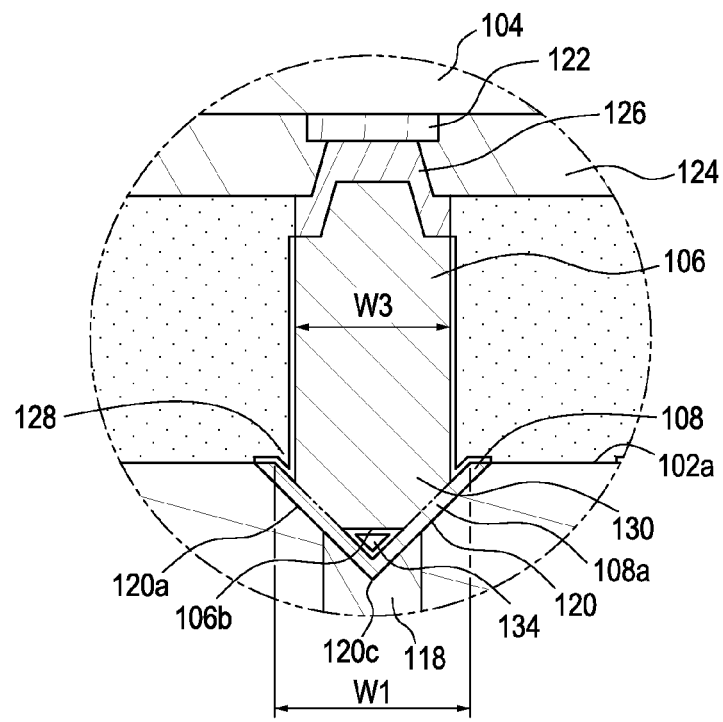
FIG. 1B illustrates an enlarged view of a bonding structure in the semiconductor package illustrated in FIG. 1 according to another embodiment of the present disclosure.

FIG. 1B illustrates a bonding structure according to another embodiment of the present disclosure. The bonding structure of this embodiment is similar to the bonding structure illustrated in FIG. 1A, except that the cross section view of the cavity 120 is in a V shape. That is, the cavity sidewalls 120a intersect and form a peak 120c (pointing downward in the orientation of FIG. 1B). Therefore, the cavity 120 does not have a cavity bottom as was shown in FIG. 1A. Such a V shape may be formed by applying a wet etching process to the substrate 102. In an embodiment, the wet etching process uses potassium hydroxide as an etchant. In the embodiment of FIG. 1B, the bonding pad 108 is disposed on at least a portion of the cavity sidewalls 120a. The bonding pad 108 conforms to the cavity sidewalls 120a and has the sloped surfaces 108a corresponding to the cavity sidewalls 120a. Such sloped surfaces 108a intersect at the peak of the V-shape of the cavity 120. Therefore, the cross section view of the bonding pad 108 that conforms to the V-shape of the cavity 120 may also have a V-shape. As shown in FIG. 1B, the V-shaped bonding pad 108 has a peak substantially aligned with the peak 120c of the cavity 120. As a result, an interspace 134 is formed between the top surface 106b (i.e., the top end) of the pillar 106 and a portion of the V-shaped bonding pad 108 around its peak. In one embodiment, the bonding pad 108 may be disposed on a portion of the cavity sidewalls 120a, without intersecting to form a peak.

The bonding pad 108 also defines an opening 130 which has a width from one side of the opening 130 to the opposite side of the opening 130, where a maximum width W1 of the opening 130 is greater than an average width W3 of the pillar 106.

Figure 2:
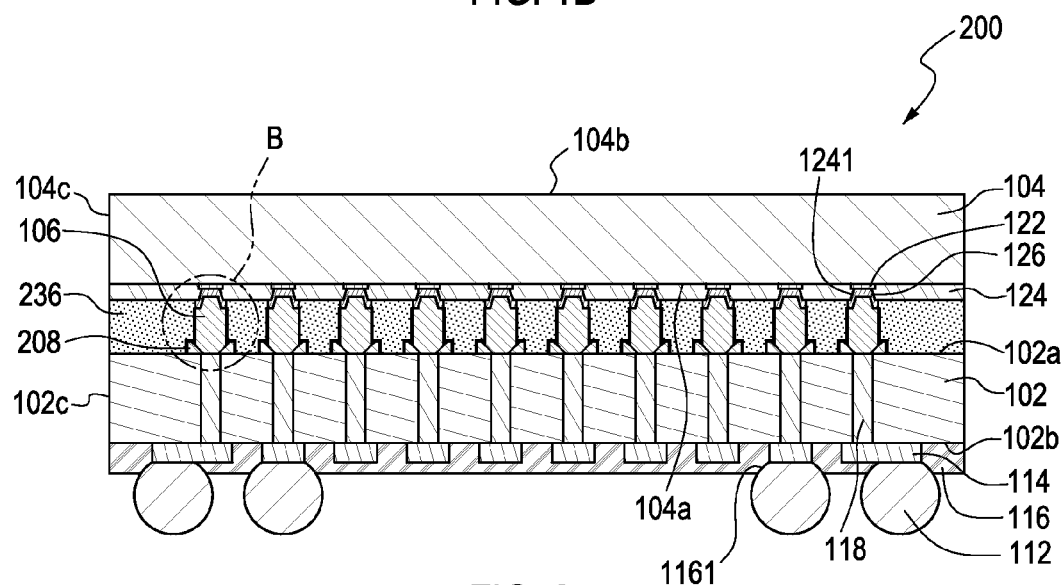
FIG. 2 illustrates a cross-sectional view of a semiconductor package according to another embodiment of the present disclosure.

FIG. 2 illustrates a cross-sectional view of a semiconductor package 200 according to another embodiment of the present disclosure. The semiconductor package 200 is similar to the semiconductor package 100 illustrated in FIG. 1 except that bonding pads 208 are disposed on the top surface 102a of the substrate 102 rather than being recessed from the top surface 102a of the substrate 102 (as shown in FIG. 1 for the bonding pads 108). Further, an insulation layer 236 is disposed between the bonding pads 208 and between the pillars 106, and contacts the insulation layer 124. The substrate 102 may be, for example, a semiconductor substrate, a printed circuit board (PCB), a ceramic substrate, or a glass substrate.

Figure 2A:
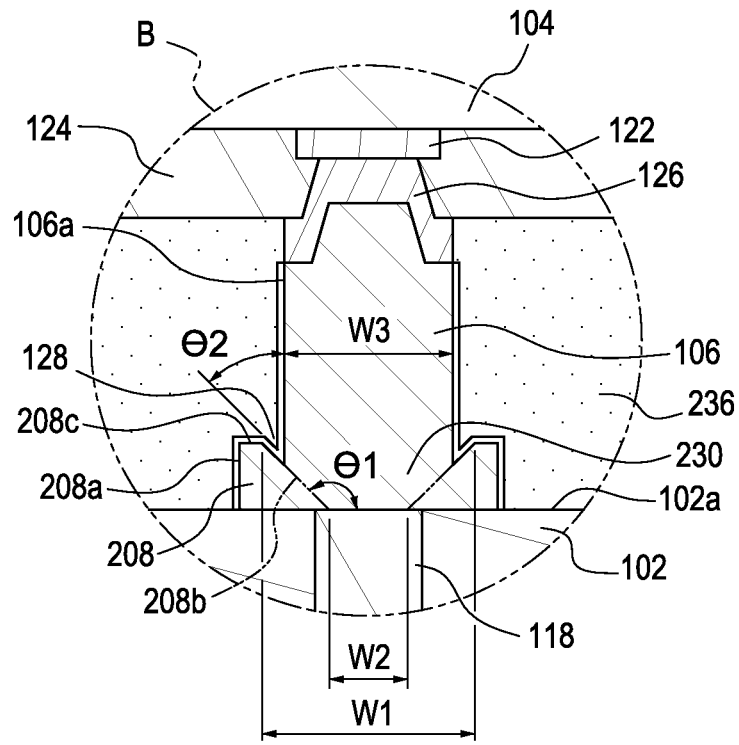
FIG. 2A illustrates an enlarged view of a bonding structure in the semiconductor package illustrated in FIG. 2 according to one embodiment of the present disclosure.

FIG. 2A illustrates an enlarged view of an area B of the bonding structure in the semiconductor package 200 illustrated in FIG. 2. The bonding structure connects the substrate 102 and the semiconductor element 104. In the portion of the bonding structure illustrated in FIG. 1B, the substrate 102 has the top surface 102a and at least one bonding pad 208. In this embodiment, the bonding pad 208 is disposed on the top surface 102a of the substrate 102. The bonding pad 208 is a tapered ring structure, which has a pad outer side surface 208a, a sloped surface 208b, and a pad top surface 208c extending from the pad outer side surface 208a to the sloped surface 208b. The sloped surface 208b of the bonding pad 208 has a slope referred to in this disclosure as L3. The pad outer side surface 208a of the bonding pad 208 is substantially perpendicular to the top surface 102a of the substrate 102, and the sloped surface 208b is tapered at an angle θ1 relative to the top surface 102a of the substrate 102 and tapered at an angle θ2 relative to the sidewall 106a of the pillar 106. The angle θ1 may be about 90° to about 105°, about 90° to about 120°, about 90° to about 135°, about 90° to about 150°, about 90° to about 165°, or about 90° to about 180° so that the sloped surface 208b is inclined with respect to the top surface 102a of the substrate 102. The angle θ2 may be about 0° to about 90°, about 0° to about 15°, about 15° to about 30°, about 30° to about 45°, about 45° to about 60°, about 60° to about 75°, or about 75° to about 90°, to form the gap 128.

The bonding pad 208 defines an opening 230 (a space enclosed by the sloped surface 208b of the bonding pad 208), and exposes a portion of the top surface 102a of the substrate 102. The opening 230 has a width from one side of the opening 230 to the opposite side of the opening 230, where a maximum width of the opening 230 is shown as W1, a minimum width of the opening 230 is shown as W2, and the maximum width W1 is greater than the minimum width W2. In addition, an exposed portion of the top surface 102a of the substrate 102 has a width W2.

As also illustrated in FIG. 2A, the pillar 106 is disposed on the UBM 126 of the semiconductor element 104. The pillar 106 is bonded to a portion of the sloped surface 208b of the bonding pad 208 to electrically connect the semiconductor element 104 to the substrate 102. The pillar 106 has a sidewall 106a with a slope referred to in this disclosure as L4. In the embodiment illustrated in FIG. 2A, the sidewall 106a is substantially perpendicular to the top surface 102a of the substrate 102, and the absolute value of the slope L3 is less than the absolute value of the slope L4. An average width W3 of the pillar 106 is designed to be greater than the minimum width W2 of the opening 230, and less than the maximum width W1 of the opening 230. Therefore, during assembly, when the pillar 106 is moved toward the bonding pad 208, the pillar 106 will contact a portion of the sloped surface 208b of the bonding pad 108, and a gap 128 is formed between a sidewall 106a of the pillar 106 and the sloped surface 208b of the bonding pad 208. In an embodiment, the average width W3 refers to the average diameter of a pillar 106. By defining the average width W3 of the pillar 106 to be greater than the minimum width W2 of the opening 230 and less than the maximum width W1 of the opening 230, or by defining the sloped surface 208b being inclined with respect to the sidewall 106a of the pillar 106 at the angle θ2, or by defining the absolute value of the slope L3 to be less than the absolute value of the slope L4, the pillar 106 can be disposed on the bonding pad 208 in a more efficient and concise manner.

As stated above, the slope of the sloped surface 208b allows the pillar 106 to slide along the sloped surface 208b during flip-chip bonding, to improve the bonding contact and the alignment tolerance of the flip-chip bonding structure.

In addition, the first insulation layer 236 is disposed between the bonding pads 208, and contacts the insulation layer 124 to provide protection from oxidation, moisture, and other environment conditions to meet the packaging application requirements. As a result, an underfill to fill the space between the substrate 102 and the semiconductor element 104 will not be necessary.

Figure 2B:
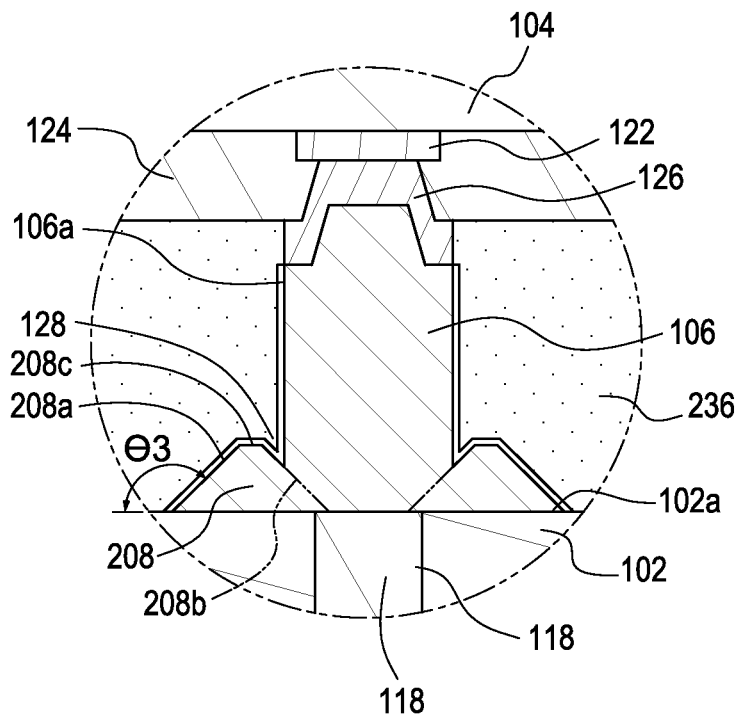
FIG. 2B illustrates an enlarged view of a bonding structure in the semiconductor package illustrated in FIG. 2 according to another embodiment of the present disclosure.

FIG. 2B illustrates a bonding structure according to another embodiment of the present disclosure. The bonding structure of this embodiment is similar to the bonding structure illustrated in FIG. 2A, except that the pad outer side surface 208a of the bonding pad 208 is tapered at an angle θ3 relative to the top surface 102a of the substrate 102. The angle θ3 may be about 90° to about 105°, about 90° to about 120°, about 90° to about 135°, about 90° to about 150°, about 90° to about 165°, or about 90° to about 180° so that the pad outer side surface 208a of the pad 208 is inclined with respect to the top surface 102a of the substrate 102.

Figure 3:
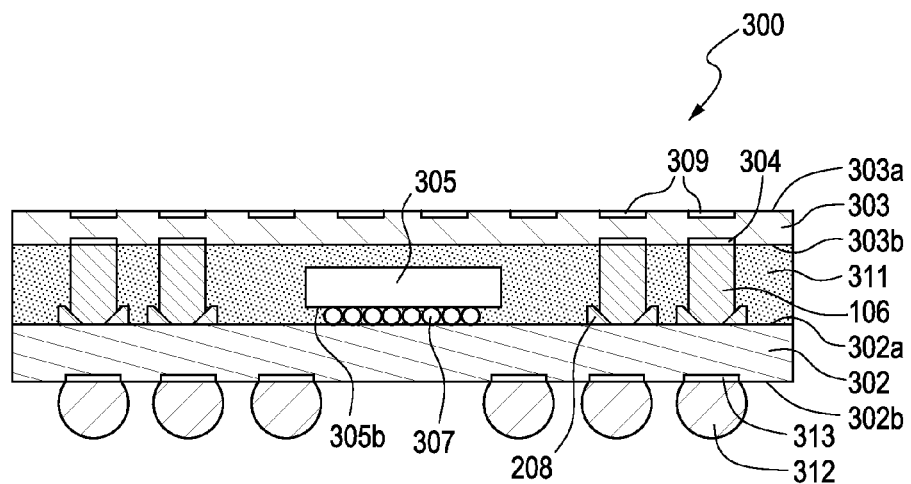
FIG. 3 illustrates a cross-sectional view of a semiconductor package according to another embodiment of the present disclosure.

FIG. 3 illustrates a cross-sectional view of a semiconductor package 300 according to another embodiment of the present disclosure. The semiconductor package 300 comprises a first substrate 302, a second substrate 303, a semiconductor device 305, a molding compound 311 and a plurality of connecting elements 312. The first substrate 302 has a top surface 302a, a bottom surface 302b, a plurality of bonding pads 208, and a plurality of bottom pads 313. The bonding pads 208 are disposed on the top surface 302a, and the bottom pads 313 are disposed adjacent to the bottom surface 302b. The bonding pads 208 are electrically connected to the bottom pads 313. The connecting elements 312 are disposed on the bottom pads 313 for external connection.

The semiconductor device 305 is mounted and electrically connected to the top surface 302a of the first substrate 302. In an embodiment, the semiconductor device 305 may be electrically connected to the top surface 302a of the first substrate 302 through a plurality of interconnectors 307, such as copper pillars or respective solder/stud/bumps, positioned on respective pads of a bottom surface 305b of the semiconductor device 305 and on respective pads of the top surface 302a of the first substrate 302. The semiconductor device 305 may be, for example, a die or a semiconductor chip.

The second substrate 303 may be an interposer, and has a top surface 303a, a bottom surface 303b, a plurality of top pads 309, a plurality of bottom pads 304 and a plurality of pillars 106. The top pads 309 are disposed adjacent to the top surface 303a, and the bottom pads 304 are disposed adjacent to the bottom surface 303b. The top pads 309 are electrically connected to the bottom pads 304. The pillars 106 are disposed on the bottom pads 304 of the second substrate 303 and bonded to the bonding pads 208 of the first substrate 302. It is noted that the bonding structure formed by the pillars 106 and the bonding pad 208 in this embodiment is similar to the bonding structure formed by the pillars 106 and the bonding pad 208 of FIG. 2 and FIG. 2A. The molding compound 311 is disposed between the bottom surface 303b of the second substrate 303 and the top surface 302a of the first substrate 302, and coves the semiconductor device 305 and the pillars 106 to provide protection from oxidation, moisture, and other environment conditions.

FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate a method for manufacturing the semiconductor package 100 according to an embodiment of the present disclosure. For example, this method can be used to manufacture the bonding structure of FIG. 1A.

Figure 4A:
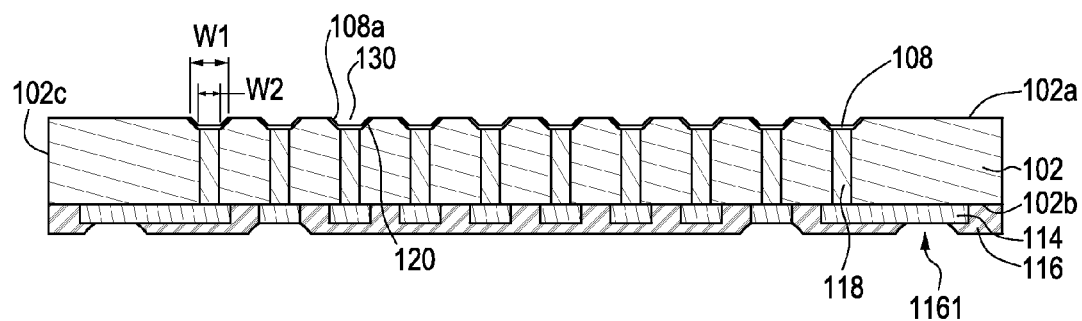
FIG. 4A, FIG. 4B, FIG. 4C, FIG. 4D, FIG. 4E, FIG. 4F, FIG. 4G, FIG. 4H, FIG. 4I, FIG. 4J, and FIG. 4K illustrate a method for manufacturing a semiconductor package according to an embodiment of the present disclosure.

Referring to FIG. 4A, the substrate 102 is provided. The substrate 102 of FIG. 4A is the same as the substrate 102 of FIG. 1 and FIG. 1A, and has the top surface 102a, the bottom surface 102b, the side surface 102c, the lower circuit layer 114, the lower insulation layer 116, the conductive vias 118, the bonding pads 108 and the cavities 120. The lower circuit layer 114 is disposed adjacent to the bottom surface 102b of the substrate 102. The lower insulation layer 116 substantially covers the lower circuit layer 114 and the bottom surface 102b of the substrate 102, and has a plurality of openings 1161 to expose at least a portion of the lower circuit layer 114. The bonding pads 108 are disposed adjacent to the top surface 102a of the substrate 102. In this embodiment, each bonding pad 108 is formed in the cavity 120 of the substrate 102 and has a sloped surface 108a with a slope L1 relative to the top surface 102a of the substrate 102, and the bonding pad 108 defines an opening 130 (a space enclosed by the sloped surface 108a of the bonding pad 108). The opening 130 has a width from one side to the opposite side of the opening 130, where the maximum width W1 of the opening 130 is greater than the minimum width W2 of the opening 130.

Figure 4B:
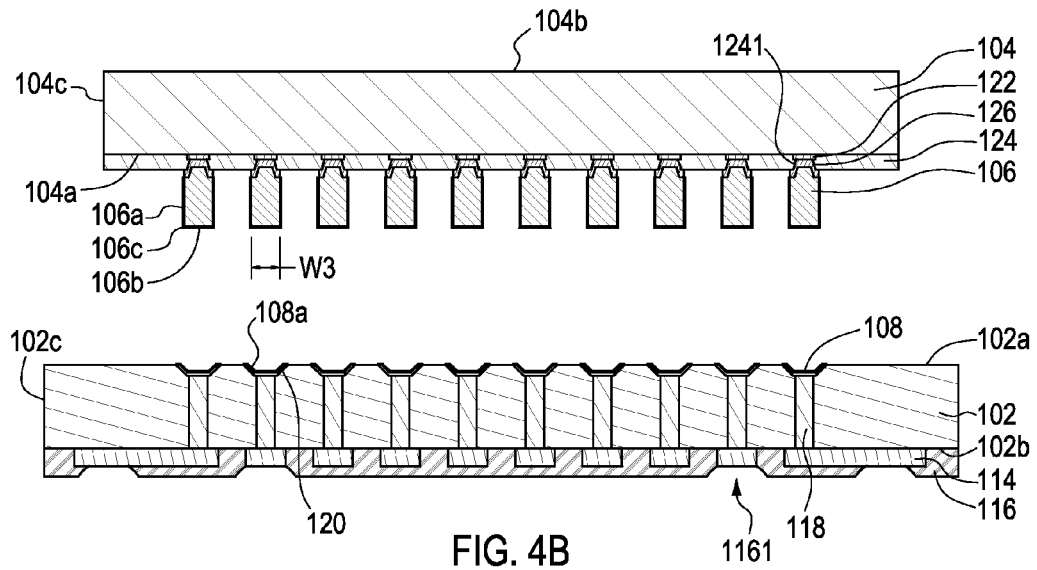

Referring to FIG. 4B, the semiconductor element 104 is provided. The semiconductor element 104 of FIG. 4B is the same as the semiconductor element 104 of FIG. 1 and FIG. 1A, and has the first surface 104a, the second surface 104b, the side surface 104c, the pads 122, the insulation layer 124, the UBMs 126, and the pillars 106. The pads 122 are disposed on the first surface 104a of the semiconductor element 104. The insulation layer 124 substantially covers the pads 122 and the top surface 104a of the semiconductor element 104, and has at least one opening 1241 to expose at least a portion of a pad 122, and a UBM 126 is disposed in the opening 1241 of the insulation layer 124 and contacts the pad 122. A pillar 106 is disposed on the UBM 126.

Each pillar 106 has a sidewall 106a with a slope L2, where the absolute value of the slope L1 of the sloped surface 108a of the bonding pad 108 is designed to be less than the absolute value of the slope L2 of the sidewall 106a. The average width W3 of the pillar 106 is designed to be greater than the minimum width W2 of the opening 130 and less than the maximum width W1 of the opening 130. The pillar 106 further has a top surface 106b and an edge portion 106c, and the edge portion 106c is at the intersection of the sidewall 106a of the pillar 106 and the top surface 106b of the pillar 106.

Figure 4C:
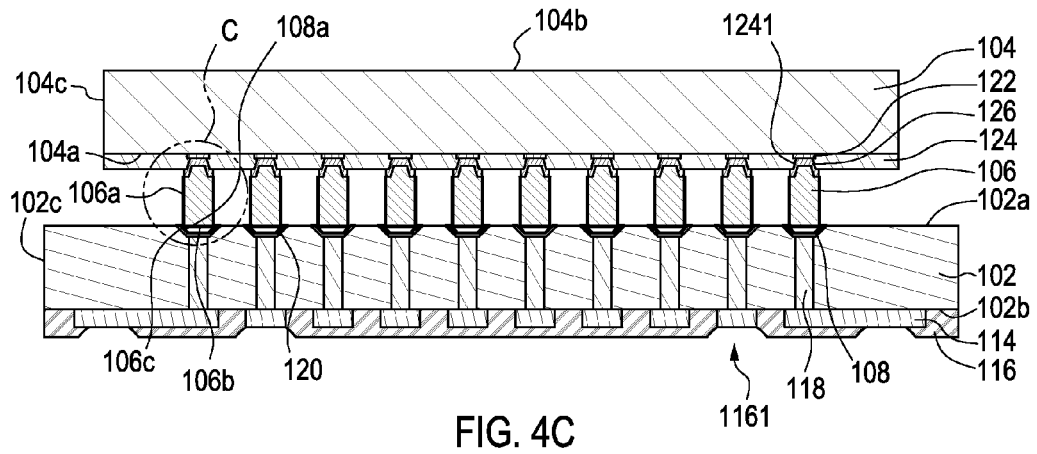

Referring to FIG. 4C, the pillar 106 of the semiconductor element 104 is bonded to a portion of the sloped surface 108a of the bonding pad 108. For example, the bond between the pillar 106 and the bonding pad 108 may be formed by thermo-compression bonding. During thermo-compression bonding, an operation pressure may be from about 0.1 megaPascals (MPa) to about 10 MPa; the operation temperature may be from about 25° C. to about 300° C., preferably from about 25° C. to about 180° C., and more preferably from about 60° C. to about 160° C.; and the operation period can be from about 1 minute to about 160 minutes.

The pillar 106 is moved towards the sloped surface 108a of the bonding pad 108 so as to form a line contact or a point contact between the edge portion 106c of the pillar 106 and the sloped surface 108a of the bonding pad 108. By designing W2<W3<W1, a large effective local pressure will occur at the contacting interface under a given tool bonding pressure since the contacting interface resides at the periphery of the top surface 106b of the pillar 106, of which the contacting interface is a line or a point contact, and the contact surface area is small. Thus, the bonding structure can be completed at a low temperature (e.g., lower than about 180° C.), and warpage does not easily occur. In an embodiment, the bonding is carried out at a temperature of from about 60° C. to about 160° C. In another embodiment, large effective local pressure can be achieved by providing the slope L1 with an absolute value less than the value of the slope L2. In another embodiment, large effective local pressure can be achieved by designing the angle θ2 (FIG. 1A) to be about 0° to about 90°.

Figure 4D:
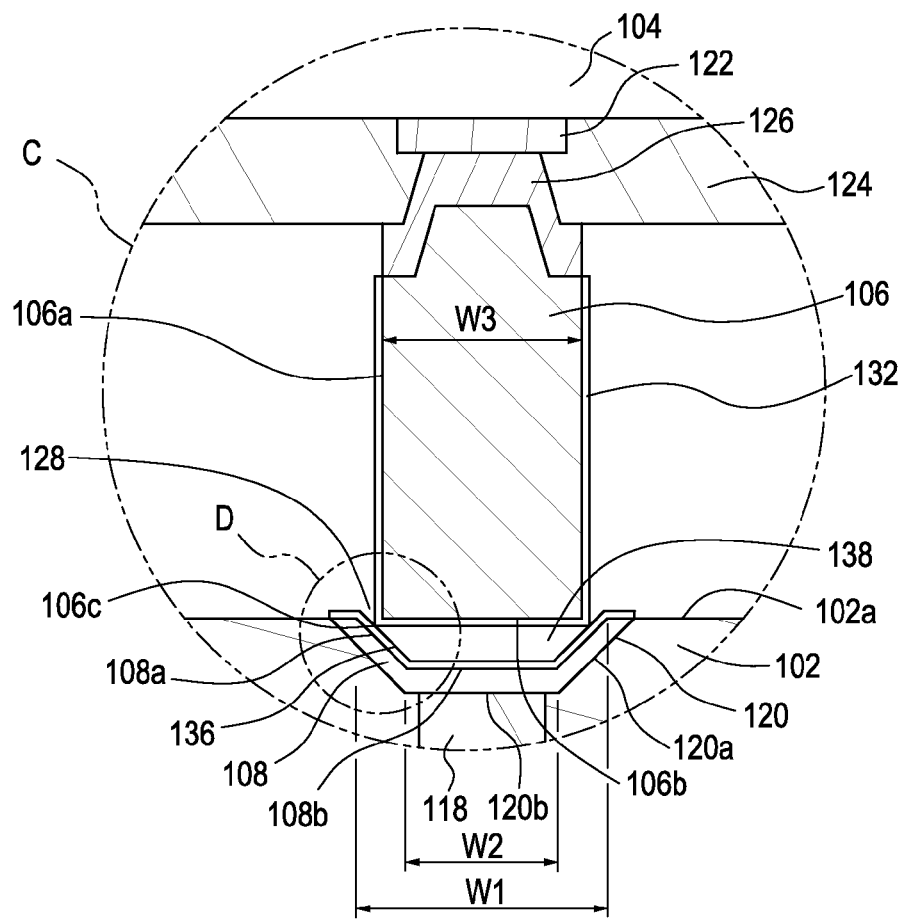

Referring to FIG. 4D, an enlarged view of an area C of a bonding structure in FIG. 4C is illustrated. The edge portion 106c of the pillar 106 is in touch with the sloped surface 108a of the bonding pad 108 by the pillar metal oxide liner 132 over the surface of the pillar 106 and the pad metal oxide liner 136 over the surface of the bonding pad 108. Meanwhile, a space 138 is formed between the top surface 106b of the pillar and the pad bottom surface 108b of the bonding pad 108, and a gap 128 is formed between a sidewall 106a of the pillar 106 and the sloped surface 108a of the bonding pad 108. The metal oxide liners 132, 136 are typically formed over the surface of the pillar 106 and the bonding pad 108 if the pillar 106 and the bonding pad 108 are made of a metal or an alloy thereof and exposed to the atmosphere. The metal oxide liners 132, 136 could be a hindrance when the bonding between the pillar 106 and the bonding pad 108 is performed. Accordingly, in some embodiments, a protection layer (including, for example, one of, or a combination of, gold, indium, tin, silver, palladium, osmium, iridium, ruthenium, titanium, magnesium, aluminum, cobalt, nickel, zinc) can be coated on the metal oxide liner 132 over the top surface 106b of pillar 106 or the metal oxide liner 136 over the bonding pad 108 to prevent the metal oxide liners 132, 136 from continuing formation. The thickness of the protection layer can be less than about 5 um.

Figure 4E:
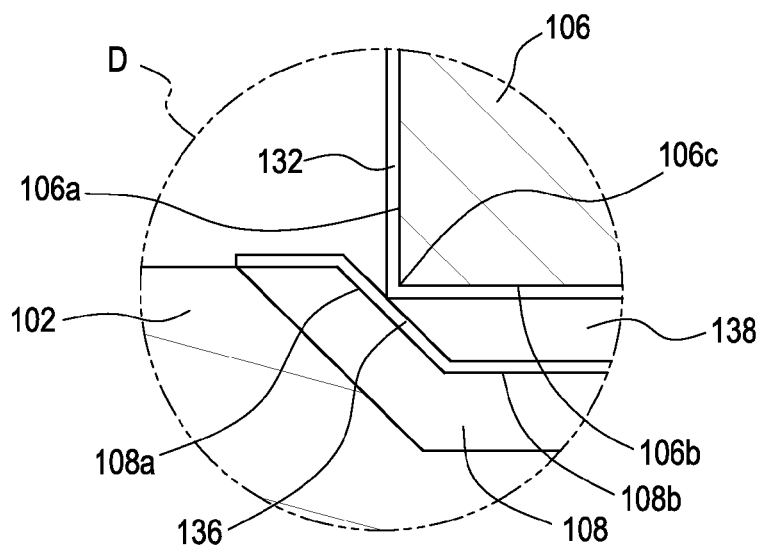

FIG. 4E illustrates an enlarged view of an area D of the embodiment illustrated in FIG. 4D at initial contact between the metal pillar 106 and the bonding pad 108 during thermo compression. As shown in FIG. 4E, the pillar 106 first contacts the bonding pad 108 by the edge portion 106c of the pillar 106, where the contacting interface is small. The pillar metal oxide liner 132 of the pillar 106 and the pad metal oxide liner 136 of the sloped surface 108a of the bonding pad 108 may form line contact or point contact. Therefore, a large effective local pressure will be produced at the contacting interface under a given tool bonding pressure because of the small contacting interface area. In addition, because the metal oxide liners 132, 136 at the small contacting interface are relatively thin, they will be penetrated and fractured more easily under a large effective local pressure.

Figure 4F:
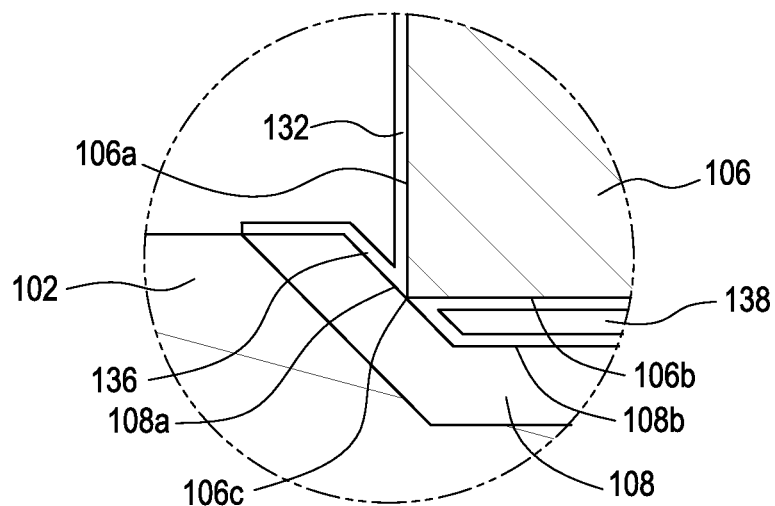

Referring to FIG. 4F, as the pillar 106 is pressed against the bonding pad 108 further during the thermo-compression process, the edge portion 106c of the pillar 106 penetrates the pillar metal oxide liner 132, and the pad metal oxide liner 136 is also penetrated around the area in contact with the sloped surface 108a of the bonding pad 108. Under this circumstance, a metal fusion diffusion bonding between the edge portion 106c of the pillar 106 and the sloped surface 108a of the bonding pad 108 will occur because of the direct contact between the pillar 106 and the bonding pad 108. Thus, a high temperature will not be necessary. In addition, the space 138 is compressed.

In another embodiment, if the protection layer is coated on the metal oxide liner 132 over the top surface 106b of the pillar 106 and on the metal oxide liner 136 over the bonding pad 108, the edge portion 106c of the pillar 106 will penetrate the protection layer on the metal oxide liner 132, and the protection layer on the metal oxide liner 136 will also be penetrated around the area in contact with the sloped surface 108a of the bonding pad 108 when the pillar 106 is pressed against the bonding pad 108 further during the thermo-compression process. Under this circumstance, since the protection layer may contain a species of metal different from that of the pillar 106 and the bonding pad 108 (such as, for example, gold, indium, tin, silver, palladium, osmium, iridium, ruthenium, titanium, magnesium, aluminum, cobalt, nickel, zinc, or an alloy thereof), a metal eutectic bonding between the edge portion 106c of the pillar 106 and the sloped surface 108a of the bonding pad 108 will occur, which also can reduce the processing temperature. In another embodiment, the metal fusion diffusion bonding and the metal eutectic bonding occur substantially simultaneously.

Figure 4G:
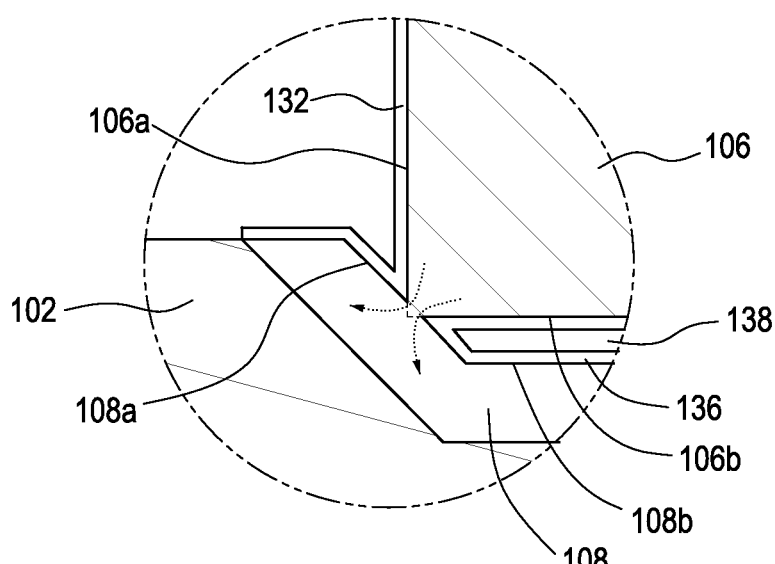

Referring to FIG. 4G, as the pillar 106 is further pressed against the sloped surface 108a of the bonding pad 108 during the thermo-compression process, the edge portion 106c of the pillar 106 penetrates the sloped surface 108a of the bonding pad 108 and the metal ions of the pillar 106 starts to diffuse into the bonding pad 108 and spread out. Thus, a metal fusion diffusion bonding occurs between the pillar 106 and the bonding pad 108. The space 138 is further compressed. In an embodiment, both the pillar 106 and the bonding pad 108 are made of copper, and thus the metal ions are copper ions. In other embodiments, as described above, if a protection layer is formed on the pillar 106, a metal fusion diffusion bonding and a metal eutectic bonding will occur substantially simultaneously.

Figure 4H:
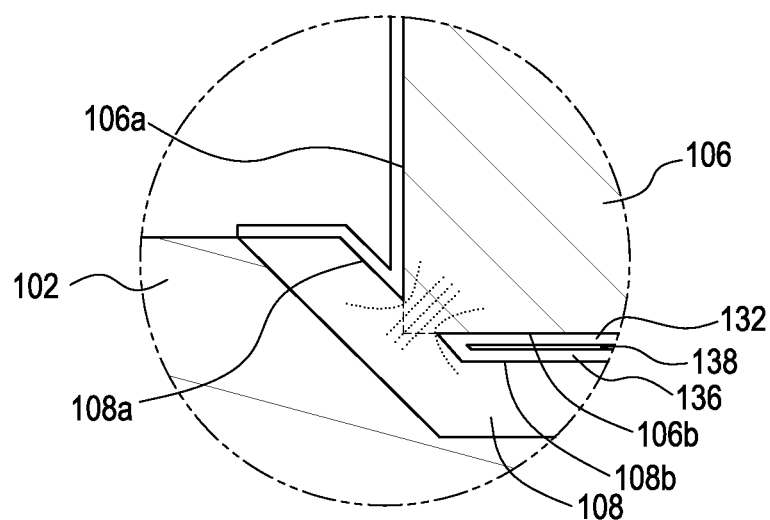

Referring to FIG. 4H, as the pillar 106 is further pressed against the sloped surface 108a of the bonding pad 108 during the thermo-compression process, more and more metal ions of the pillar 106 diffuse into the bonding pad 108. In addition, increasingly more pillar metal oxide liners 132 and pad metal oxide liner 136 are fractured. Meanwhile, the contact between the pillar 106 and the bonding pad 108 becomes surface contact. In addition, the space 138 is further compressed and there is only limited space left between the pillar metal oxide liner 132 and the pad metal oxide liner 136.

Figure 4I:
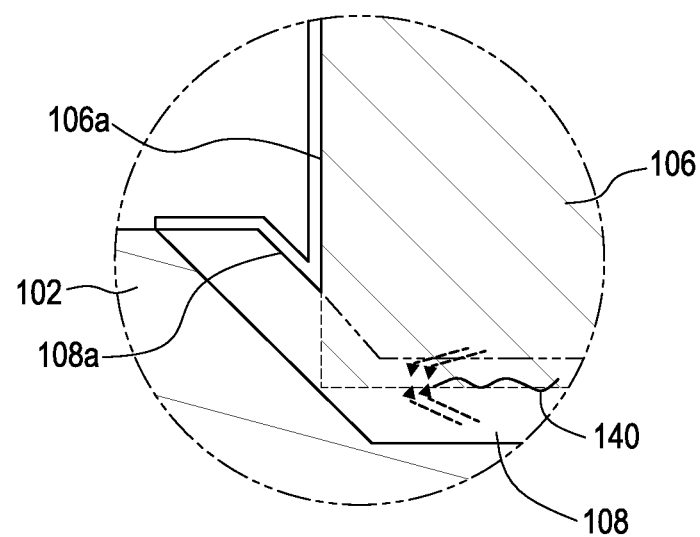

Referring to FIG. 4I, as the pillar 106 continues to be pressed toward the bonding pad 108 during the thermo-compression process, the pillar metal oxide liner 132 of the pillar 106 and the pad metal oxide liner 136 of the bonding pad 108 are fractured because of the continuing diffusion of the metal ions, and the top surface 106b of the pillar 106 contacts the pad bottom surface 108b of the bonding pad 108. Then, the metal oxide liners 132, 136 are crushed due to the push of the diffusion of the metal ions. It is noted that the interface 140 between the pillar 106 and the bonding pad 108 is blurring and may not have a clear boundary at this stage.

Figure 4J:
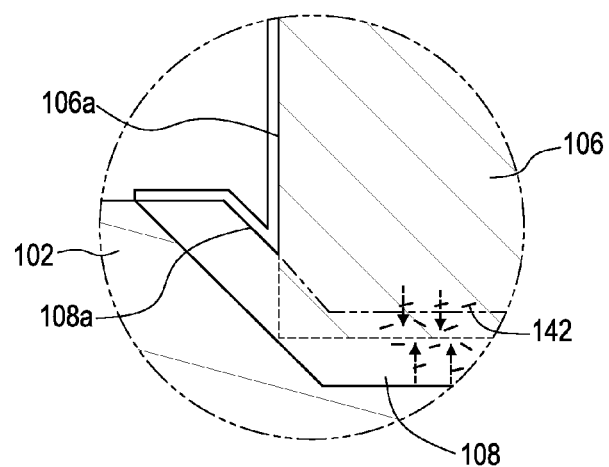

Referring to FIG. 4J, as the thermo-compression process continues, more metal ions inter-diffuse between the pillar 106 and the bonding pad 108 and spread out. As a result, the interface 140 disappears, and oxygen ions 142 in the original metal oxide liners 132, 136 are driven to diffuse and spread out. Therefore, the oxygen ions 142 are distributed in the diffusion layer between the pillar 106 and the bonding pad 108 rather than being concentrated at the interface 140. Thus, the metal oxide liners 132, 136 are substantially reduced or eliminated between the pillar 106 and the bonding pad 108, and the bonding of the pillar 106 and the bonding pad 108 is complete.

Figure 4K:
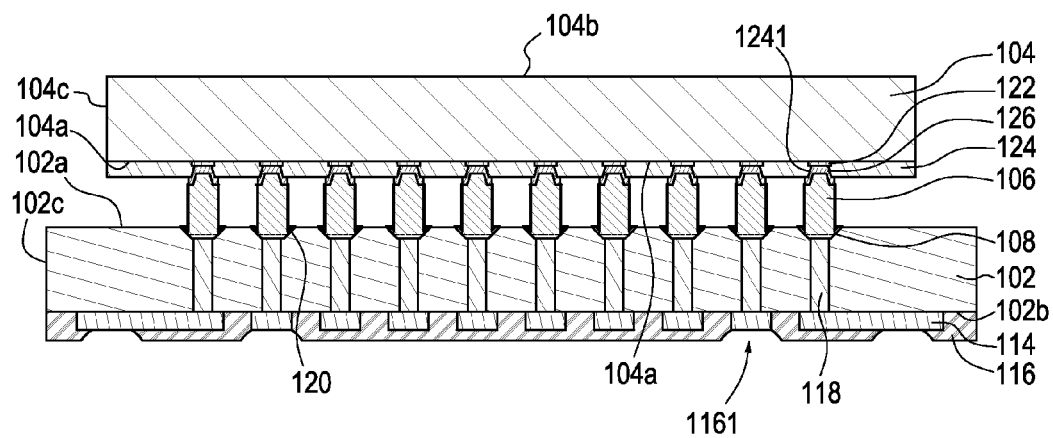

Referring to FIG. 4K, a semiconductor package including the bonding structure of FIG. 4J is illustrated after the bonding.

An underfill material may then be filled into the space between the substrate 102 and the semiconductor element 104 to form an underfill 110 (FIG. 1) therein. The underfill 110 may be disposed between the pillars 106 and may cover at least a portion of the top surface 102a of the substrate 102 and at least a portion of the insulation layer 124. Then, the connecting elements 112 (FIG. 1) may be attached to the exposed lower circuit layer 114 in the opening 116I of the lower protection layer 116 so as to obtain the semiconductor package 100 as illustrated in FIG. 1.

Figure 5A:
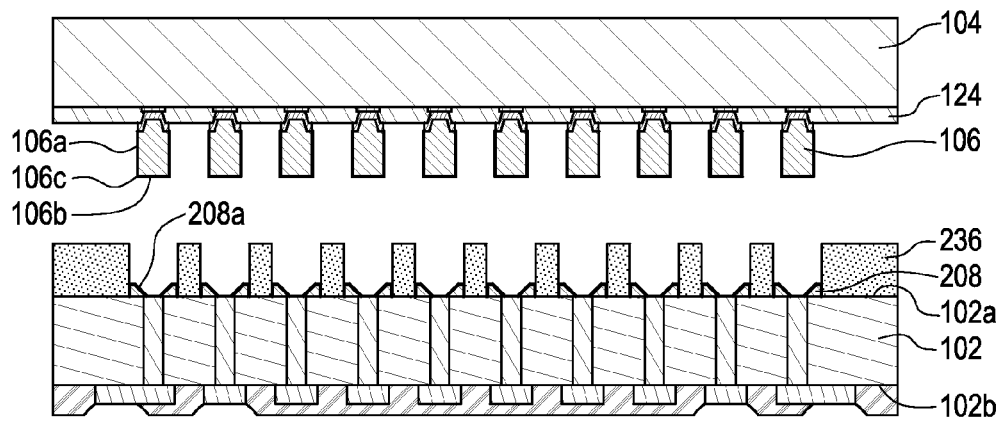
FIG. 5A and FIG. 5B illustrate a method for manufacturing a semiconductor package according to another embodiment of the present disclosure.
Figure 5B:
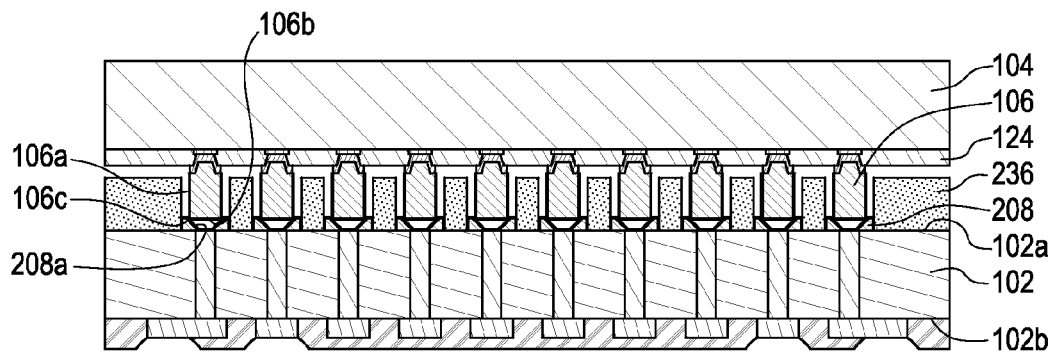

FIG. 5A and FIG. 5B illustrate a method for manufacturing a semiconductor package according to another embodiment of the present disclosure. For example, this method can be used to manufacture the semiconductor package 200 described in connection with FIG. 2.

Referring to FIG. 5A, a substrate 102 and a semiconductor element 104 are provided. The semiconductor element 104 of this embodiment is the same as the semiconductor element 104 illustrated in FIG. 4B. The substrate 102 of this embodiment is similar to the substrate 102 illustrated in FIG. 4B, and the difference is described as follows. In this embodiment, the bonding pad 208 is disposed on the top surface 102a of the substrate 102 rather than being recessed from the top surface 102a of the substrate 102. The bonding pad 208 is a tapered ring structure, which has a sloped surface 208a. The substrate 102 includes an insulation layer 236 disposed on the top surface 102a of the substrate 102 and between the bonding pads 208.

Referring to FIG. 5B, the semiconductor element 104 is moved to the substrate 102 so that the edge portion 106c of the pillar 106 contacts the sloped surface 108a of the bonding pad 108. Then, the pillar 106 of the semiconductor element 104 is bonded to a portion of the sloped surface 108a of the bonding pad 108 using thermo-compression, such as using the thermo-compression described above. In addition, the insulation layer 236 will contact and combine with the insulation layer 124 to provide protection from oxidation, moisture, and other environment conditions. In this embodiment, an underfill will not be necessary and a cost in this regard can be reduced. After the semiconductor element 104 and the substrate 102 are bonded together, the connecting elements 112 may be attached to the exposed lower circuit layer 114 of the semiconductor element 104 so as to obtain the semiconductor package 200 as illustrated in FIG. 2.

As used herein and not otherwise defined, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Additionally, "substantially perpendicular" as used in this disclosure is accounts for small angular variations from 90°, such as less than or equal to ±1°, less than or equal to ±2°, less than or equal to ±3°, less than or equal to ±4°, or less than or equal to ±5°. Further, "substantially simultaneously" as used in this disclosure accounts for small variations in time, such as less than or equal to ±1 microsecond, less than or equal to ±1 millisecond, or less than or equal to ±1 second.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A bonding structure, comprising:
   a substrate, having a top surface and comprising at least one bonding pad, wherein the bonding pad is disposed adjacent to the top surface of the substrate and has a sloped surface; and
   a semiconductor element, comprising at least one pillar;
   wherein each pillar is bonded to a portion of the sloped surface of a corresponding one of the at least one bonding pad, and a gap is formed between a sidewall of the pillar and the sloped surface of the corresponding bonding pad;
   wherein the substrate further comprises a first insulation layer disposed on the top surface thereof and between the bonding pads, and the semiconductor element further comprises a second insulation layer between the pillars, wherein the first insulation layer contacts the second insulation layer.

2. The bonding structure of claim 1, wherein the substrate defines at least one cavity, and each bonding pad is disposed on a sidewall of a corresponding one of the at least one cavity.

3. The bonding structure of claim 2, wherein a cross section of at least one cavity is in a V shape or a trapezoid shape.

4. The bonding structure of claim 2, wherein an interspace is formed between an end of each pillar and a portion of the corresponding bonding pad.

5. The bonding structure of claim 1, wherein the at least one bonding pad is disposed on the top surface of the substrate and at least one bonding pad is a tapered ring structure.

6. The bonding structure of claim 5, wherein at least one bonding pad exposes a portion of the top surface of the substrate.

7. The bonding structure of claim 1, wherein there is an inclination angle between the sidewall of at least one pillar and the sloped surface of the corresponding bonding pad.

8. The bonding structure of claim 1, wherein a space defined by the sloped surface of at least one bonding pad has a maximum width and a minimum width, and a width of the corresponding pillar is greater than the minimum width of the space and less than the maximum width of the space.

9. A bonding structure, comprising:
   a substrate, having a top surface and comprising at least one bonding pad, wherein each bonding pad is disposed adjacent to the top surface of the substrate and has a sloped surface with a first slope; and
   a semiconductor element, comprising at least one pillar, wherein each pillar is bonded to a portion of the sloped surface of a corresponding one of the at least one bonding pad and has a sidewall with a second slope, and wherein the absolute value of the first slope is less than the absolute value of the second slope.

10. The bonding structure of claim 9, wherein the substrate defines at least one cavity, and at least one bonding pad is disposed on a sidewall of a corresponding one of the at least one cavity.

11. The bonding structure of claim 10, wherein a cross section of at least one cavity is in a V shape or a trapezoid shape.

12. The bonding structure of claim 10, wherein an interspace is formed between an end of at least one pillar and a portion of the corresponding bonding pad.

13. The bonding structure of claim 10, wherein a portion of each pillar is accommodated within the corresponding one of the at least one cavity.

14. The bonding structure of claim 9, wherein the bonding pads are disposed on the top surface of the substrate and at least one bonding pad is a tapered ring structure.

15. The bonding structure of claim 14, wherein at least one bonding pad exposes a portion of the top surface of the substrate.

16. The bonding structure of claim 9, wherein the substrate further comprises a first insulation layer disposed on the top surface thereof and between the bonding pads, and the semiconductor element further comprises a second insulation layer between the pillars, wherein the first insulation layer contacts the second insulation layer.

17. The bonding structure of claim 9, wherein there is an inclination angle between the sidewall of at least one pillar and the sloped surface of a corresponding one of the at least one bonding pad.

18. The bonding structure of claim 17, wherein the inclination angle is 0° to about 90°.

19. The bonding structure of claim 9, wherein a space defined by the sloped surface of at least one bonding pad has a maximum width and a minimum width, and a width of a corresponding one of the at least one pillar is greater than the minimum width of the space and less than the maximum width of the space.

* * * * *